(12) United States Patent
Joo et al.

(10) Patent No.: US 7,701,745 B2
(45) Date of Patent: Apr. 20, 2010

(54) MEMORY DEVICE DRIVING CIRCUIT

(75) Inventors: Won Jae Joo, Hwaseong-si (KR); Sang Kyun Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 297 days.

(21) Appl. No.: 11/652,555

(22) Filed: Jan. 12, 2007

(65) Prior Publication Data

US 2007/0268730 A1    Nov. 22, 2007

(30) Foreign Application Priority Data

May 22, 2006    (KR) .................... 10-2006-0045631

(51) Int. Cl.
*G11C 11/00* (2006.01)
(52) U.S. Cl. .................... 365/148; 365/100; 365/158
(58) Field of Classification Search ................ 365/148, 365/100, 158
See application file for complete search history.

(56) References Cited

U.S. PATENT DOCUMENTS

| | | | |
|---|---|---|---|
| 6,141,241 A * | 10/2000 | Ovshinsky et al. .......... 365/163 |
| 6,928,022 B2 * | 8/2005 | Cho et al. ................. 365/225.7 |
| 6,940,744 B2 * | 9/2005 | Rinerson et al. ............ 365/148 |
| 7,417,247 B2 * | 8/2008 | Schmid et al. ................. 257/40 |
| 2006/0227592 A1 * | 10/2006 | Parkinson et al. ........... 365/148 |

* cited by examiner

*Primary Examiner*—Son Dinh
*Assistant Examiner*—Nam Nguyen
(74) *Attorney, Agent, or Firm*—Harness, Dickey & Pierce, P.L.C.

(57) ABSTRACT

A memory device driving circuit is disclosed which drives a memory device including a first electrode, a second electrode, and a memory layer interposed between the first electrode and the second electrode. The memory device driving circuit may include a main driver connected to the memory device, to drive the memory device, and a secondary driver connected between the memory device and the main driver, to control a set resistance of the memory device. The memory device driving circuit may freely adjust the set resistance of the memory device, to maintain the resistance of the memory device at a desired value. Accordingly, an improvement in the operation reliability of the memory device may be achieved.

16 Claims, 5 Drawing Sheets

MEMORY DEVICE DRIVING CIRCUIT

PRIORITY STATEMENT

This application claims priority under 35 USC §119 to Korean Patent Application No. 10-2006-0045631, filed May 22, 2006, in the Korean Intellectual Property Office (KIPO), the entire contents of which are herein incorporated by reference.

BACKGROUND

1. Field

Example embodiments relate to a memory device driving circuit for driving a resistive memory device capable of having two or more states in accordance with a variation in resistance and a method of fabricating the same. Other example embodiments relate to a memory device driving circuit which may include a secondary driver connected to a memory device including a memory layer arranged between a first electrode and a second electrode, to control a set resistance of the memory device and a method of fabricating the same.

2. Description of the Related Art

In accordance with recent development of data compression and transmission techniques, development of new electronic appliances (e.g., portable terminals, various smart cards, electronic cash, digital cameras, memories for games, MP3 players and/or multimedia players) has increased. Such new electronic appliances may be configured to use an increased amount of information. The demand for various memory devices capable of storing an increased amount of data may have also been increased. Increased use of portable information appliances may have increased the demand for a memory device having non-volatile characteristics preventing or reducing recorded information from being erased even in a power-off state. Most memory devices may include a bistable element which is switchable between a higher resistance state and a lower resistance state upon receiving a voltage. Resistive memory devices, which have a concept compared to capacitive memory devices, may include a memory that varies in resistance in accordance with a voltage applied thereto, and may store data corresponding to the resistance variation.

Chalcogenide materials, semiconductor, and various oxides and nitrides may have resistive memory properties. Organic materials may have resistive memory properties. Resistive memory devices may have drawbacks of increased driving voltage and current, decreased durability and decreased thin film handling properties. Because such drawbacks have been overcome in accordance with recent developments of material engineering, resistive memory devices may be currently non-volatile, lower-power, higher-density, and multi-bit operating memories. Examples of such a resistive memory device may include a phase change RAM, an organic memory, an oxide resistive RAM (OxRAM) and/or a metal filament memory.

The resistive memory device will be described in conjunction with, for example, the organic memory. The organic memory may include an organic memory layer between an upper electrode and a lower electrode. Memory cells providing bistability characteristics may be formed at points where the upper and lower electrodes cross each other.

The memory cells of the resistive memory device may have two states, namely, a set state corresponding to a lower resistance state and a reset state corresponding to a higher resistance state. When it is assumed that data of "1" corresponds to the lower resistance state, and data of "0" corresponds to the higher resistance state, two logic states of data may be stored.

In such a memory device, read-out of data may be carried out as follows. One bit line and one word line may be selected from a memory matrix, to select a specific memory cell. Thereafter, current may be supplied from the outside of the memory device to the specific memory cell. A voltage variation may occur in the memory cell in accordance with the resistance state of the organic memory layer in the memory cell. In accordance with the voltage variation, data of "0" or "1" may be read out.

In most memory devices, however, an accurate read out of the voltage variation may be difficult unless a separate amplifier is used, because the resistance in the set state may be relatively small. The configuration of such a memory device may become complex. The resistance in the set state may be non-uniform. Errors may be generated during the operation of the memory device for reading the memory cell.

SUMMARY

Example embodiments provide a memory device driving circuit which is capable of freely controlling the resistance of a memory device, driven by the driving circuit, in a set state and a method of fabricating the same. Example embodiments provide a memory device driving circuit which may prevent or reduce erroneous operations of a memory device driven by the driving circuit, thereby achieving an improvement in operation reliability, and a method of fabricating the same.

Example embodiments provide a memory device driving circuit for driving a memory device including a first electrode, a second electrode, and a memory layer between the first electrode and the second electrode which may include a main driver connected to the memory device, to drive the memory device; and a secondary driver connected between the memory device and the main driver, to control a set resistance of the memory device. The main driver may comprise an I/O control, column and row address decoders, and WL (word line) driver.

The secondary driver may be externally connected to the memory device, or may be internally formed in the memory device.

Where the secondary driver is externally connected to the memory device, the secondary driver may comprise a first diode connected to one end of the memory device, a second diode connected to the first diode in parallel, and a resistor connected to the first diode in series, and connected to the second diode in parallel. The first and second diodes are connected to be oppositely biased.

The resistor may have a first terminal connected to the main driver, and a second terminal connected to the first diode. Each of the first and second diodes may be a P-N diode and/or a Schottky diode.

Where the secondary drive is internally formed in the memory device, the secondary driver may be a Schottky junction between the first electrode and the memory layer in the memory device. The Schottky junction may include a semiconductor layer contacting a metal material of the second electrode. The Schottky barrier may be formed at a metal-semiconductor junction and may have rectifying characteristics, suitable for use as a diode. The rectifying properties may depend on the work function of the metal and the band gap of the semiconductor.

According to example embodiments, a method for fabricating a memory device driving circuit for driving a memory device including a first electrode, a second electrode, and a memory layer between the first electrode and the second electrode may include connecting a main driver to the memory device, to drive the memory device and connecting a secondary driver between the memory device and the main driver, to control a set resistance of the memory device.

BRIEF DESCRIPTION OF THE DRAWINGS

Example embodiments will be more clearly understood from the following detailed description taken in conjunction with the accompanying drawings. FIGS. 1-6C represent non-limiting, example embodiments as described herein.

DETAILED DESCRIPTION OF EXAMPLE EMBODIMENTS

Various example embodiments will now be described more fully with reference to the accompanying drawings in which some example embodiments are shown. In the drawings, the thicknesses of layers and regions may be exaggerated for clarity.

Detailed illustrative example embodiments are disclosed herein. Specific structural and functional details disclosed herein are merely representative for purposes of describing example embodiments. Example embodiments may, however, be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments. Like numbers refer to like elements throughout the description of the figures.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath", "below", "lower", "above", "upper" and the like, may be used herein for ease of description to describe one element or a feature's relationship to another element or feature as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Schottky diode may be a semiconductor diode with a lower forward voltage drop and more rapid switching action.

Example embodiments provide a circuit for driving a memory device including a first electrode, a second electrode, and a memory layer interposed between the first and second electrodes. The driving circuit may include a main driver for driving the memory device, and a secondary driver connected between the memory device and the main driver, and adapted to control the set resistance of the memory device.

Figure 1:
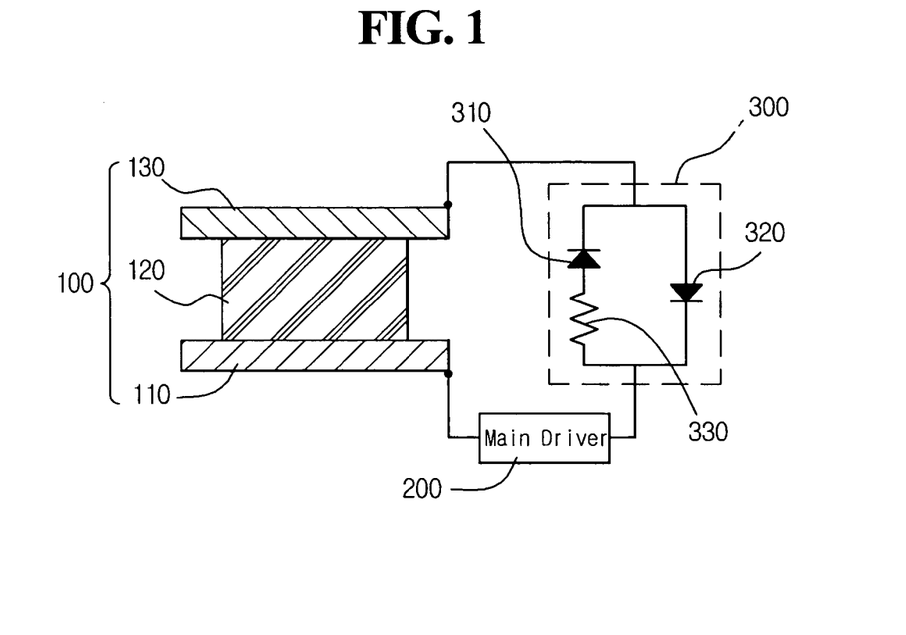
FIG. 1 is a diagram illustrating a memory device driving circuit according to example embodiments.

FIG. 1 is a diagram illustrating a memory device driving circuit according to example embodiments. Referring to FIG. 1, the memory device driving circuit may function to drive a memory device 100, and may include a main driver 200 and a secondary driver 300. The secondary driver 300 may be connected between the memory device 100 and the main driver 200, to control the set resistance of the memory layer 120. The memory layer 120 means an active layer usable in organic memory devices or a memory layer usable in any other types of memory devices as long as it may have two or more states in accordance with a variation in resistance.

The secondary driver 300 in the memory device driving circuit of example embodiments may be implemented using various methods. For example, the secondary driver 300 may be externally connected to the memory device 100, or may be internally formed in the memory device 100.

Where the secondary driver 300 is externally connected to the memory device 100 in accordance with example embodiments, the secondary driver 300 may include two diodes and one resistor, as shown in FIG. 1. In detail, the secondary driver 300 may include a first diode 310 connected to one end of the memory device 100, a second diode 320 connected to the second diode 320 in parallel, and a resistor 330 connected to the second diode 320 in parallel. The first and second diodes 310 and 320 are connected such that they are oppositely biased when a voltage is applied thereto. Accordingly, when a positive voltage is supplied to the secondary driver 300, current flows through only the first diode 310. No current flows through the second diode 320.

In example embodiments, there may be no limitation on diodes useable as the first diode 310 and/or second diode 320. A P-N diode and/or a Schottky diode may be usable as the first diode 310 and/or second diode 320. Although the forward turn-on voltage of the P-N diode is about 0.6 V to about 0.7 V, the Schottky diode may have a forward turn-on voltage reduced to about 0.2 V to about 0.3 V using a Schottky barrier. When a memory device uses a reduced turn-on voltage, it may be possible to correspondingly reduce the reading voltage of the memory device. In example embodiments, the first and second diodes 310 and 320 be implemented using the same kind of diodes.

Figure 2:
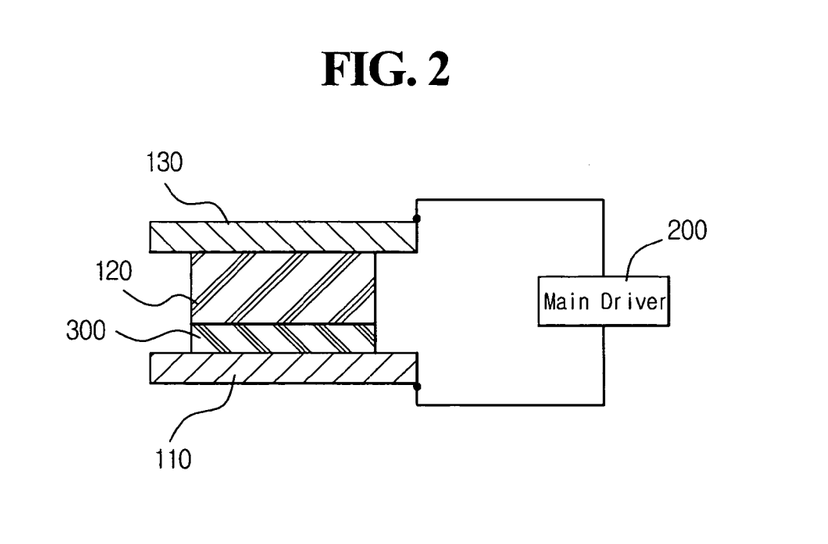
FIG. 2 is a diagram illustrating a memory device driving circuit according to example embodiments.

In accordance with example embodiments, the secondary driver 300 may be internally formed in the memory device 100. The memory device driving circuit according to this embodiment is illustrated in FIG. 2. As shown in FIG. 2, the secondary driver 300 may be fabricated in the form of a Schottky junction between the first electrode 110 of the memory device 100 and the memory layer 120. A semiconductor layer may be attached to a metal surface of the first electrode 110 by depositing and/or coating a semiconductor over the metal surface of the first electrode 110.

The memory device 100 has a structure in which the memory layer 120 is interposed between the first electrode 110 and the second electrode 130, as described above. When a voltage is supplied to the memory device 100 having the above-described structure, the memory layer 120 may exhibit a bistable resistance. The memory layer 120 may exhibit memory characteristics. When an organic memory device with a memory layer made of an organic material, memory characteristics may be exhibited by virtue of the properties of the organic material. The memory device may exhibit non-volatile characteristics.

In the memory device driving circuit of example embodiments, there may be no particular limitation on the material of the memory layer 120 of the memory device 100. The material of the memory layer 120 may depend on the switching method of the memory device 100. For example, an organic memory device operating in accordance with connection or disconnection of a metal filament between the electrodes of the memory device, the memory layer thereof may be made of a conductive polymer having heteroatoms.

Alternatively, the memory layer 120 may be made of a non-conductive organic material having heteroatoms while exhibiting electrical conductivity of about $10^{-12}$ S/cm or less. Metal ions may be liberated from the second electrode 130 in accordance with ionization when a positive voltage is supplied to the memory device 100. The liberated metal ions may be diffused or drifted into the memory layer 120 under a certain electrical bias, so that the electrical conductivity of the memory layer 120 may be varied due to the distribution of the metal ions in the memory layer 120. As a result, the memory layer 120 may exhibit memory characteristics. Examples of such an organic material include poly(2-vinyl pyridine), poly(4-vinyl pyridine), polyvinyl pyrolidone, polyallylamine, polyethyleneamine, polyacrylamide, polyamidoamine, and polyimide. Alternatively, some or all of the liberated metal ions may be incorporated in the memory layer, thereby reducing or eliminating the need for metal ion diffusion from the second electrode.

The first and second electrodes 110 and 130 may be made of a metal (e.g., gold, silver, platinum, copper, cobalt, nickel, tin, aluminum, indium tin oxide, titanium and/or other conductive materials).

The main driver 200 may be connected, at one end thereof, to the memory device 100, and may be connected, at the other end thereof, to the secondary driver 300. The main driver 200 may drive the memory device 100 by applying a pulse voltage to the memory device 100 via the secondary driver 300.

The memory device 100 may be implemented in the form of a memory matrix. Such a memory matrix may be formed on an appropriate substrate made of glass and/or silicon. The memory matrix may have a common word line, to enable storing and recording of data in a plurality of cells, and reading and erasing of the stored and/or recorded data. For the substrate, a general organic and/or inorganic substrate may be used. A flexible substrate may be used.

Hereinafter, operation of the memory device driving circuit according to example embodiments will be described in conjunction with, for example, the above-described memory device in which a variation in resistance occurs in accordance with the distribution of metal ions in the memory layer.

The first and second diodes 310 and 320 of the secondary driver 300 are connected such that they are oppositely biased when a voltage is supplied to the memory device 100. The resistor 330 may be connected in series to the first diode 310. The first and second diodes 310 and 320 may be arranged such that, when a positive voltage is supplied to the memory device, the first diode 310 connected with the resistor 330 may be forwardly biased, and the second diode 320 may be reversely biased. Accordingly, when a positive voltage is applied, the memory device 100 receives the voltage via the resistor 330. When a negative voltage is applied, the memory device 100 may directly receive the voltage, not via the resistor 330.

Figure 3:
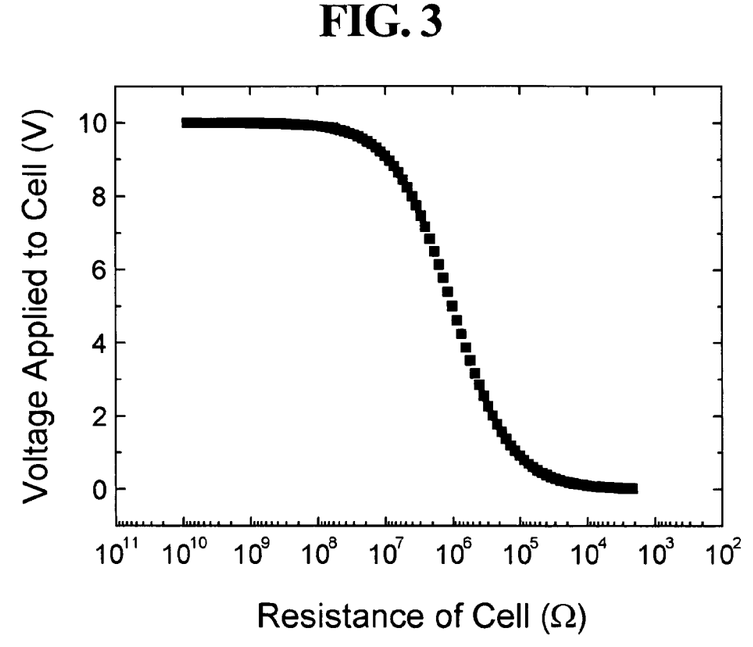
FIG. 3 is a graph depicting the relation between a memory cell resistance and an applied voltage in the memory device driving circuit of example embodiments.

When a positive voltage is applied across the memory device 100, the first diode 310 connected in series to the resistor 330 may be forwardly biased. As a result, the applied voltage may be supplied to a specific memory cell of the memory device 100, thereby causing the resistance of the memory cell to be reduced. When the resistance of the memory cell reaches a value identical to the resistance of the resistor 330 of the secondary driver 300, the applied voltage may be abruptly reduced to a half value thereof in accordance with Ohm's Law. For example, when a voltage of about 10 V is applied, the applied voltage may be abruptly reduced to about 5 V when the resistance of the memory cell reaches a value identical to the resistance ($10^6 \Omega$) of the resistor 330 of the secondary driver 300, as shown in FIG. 3.

When the applied voltage is reduced as described above, the force moving metal ions in the cell of the memory device 100 exhibiting resistive memory characteristics by virtue of the distribution of the metal ions, as described above, may be weakened. The resistance of the memory cell may be fixed at the reduced value. For example, when a voltage of about 2 V is externally applied for about one second, the resistance of the memory cell may be reduced to a value corresponding to the resistance of the resistor 330 of the secondary driver 300 within about 0.1 second. For this reason, the voltage of about 2 V may be applied to the memory cell only for about 0.1 second. For the remaining about 0.9 second, a voltage of about 1 V may be applied to the memory cell. As a result, the movement of the metal ions may be suppressed, thereby causing the resistance of the memory cell to be fixed without any variation.

Figure 4:
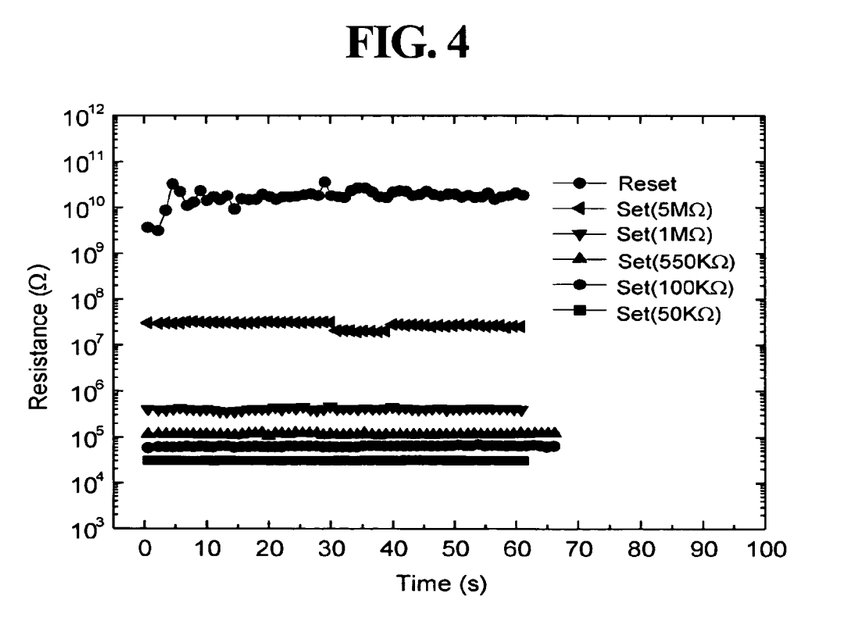
FIG. 4 is a graph depicting results obtained in accordance with a variation in set resistance carried out by a secondary driver in the memory device driving circuit of example embodiments.

FIG. 4 is a graph depicting a variation in the resistance of the memory cell depending on a variation in the resistance of the resistor 330 of the secondary driver 300. As shown in FIG. 4, in the memory device driving circuit of example embodiments, it may be possible to adjust the set resistance of the memory cell by adjusting the resistance of the resistor 330 of the secondary driver 300. When the set resistance is undesirably high, there may be a problem in that the power consumption required to drive the memory device 100 may be undesirably increased. This may be solved by adjusting the set resistance of the memory cell using the secondary driver 300.

When an appropriate voltage is applied across the memory device 100 via the main driver 200 in accordance with example embodiments, as described above, the memory layer 120 may be switched between a higher resistance state and a lower resistance state. When metal ions are uniformly diffused in the memory layer 120 between the first electrode 110 and the second electrode 130 in accordance with the voltage application, the memory layer 120 may be switched to a reset state corresponding to a higher resistance state. When the metal ions are moved toward the first electrode 110, the memory layer 120 may be switched to a set state corresponding to a higher resistance state. For example, when it is assumed that data of "1" corresponds to the lower resistance state, and data of "0" corresponds to the higher resistance state, the two logic states of data may be stored.

Figure 5A:
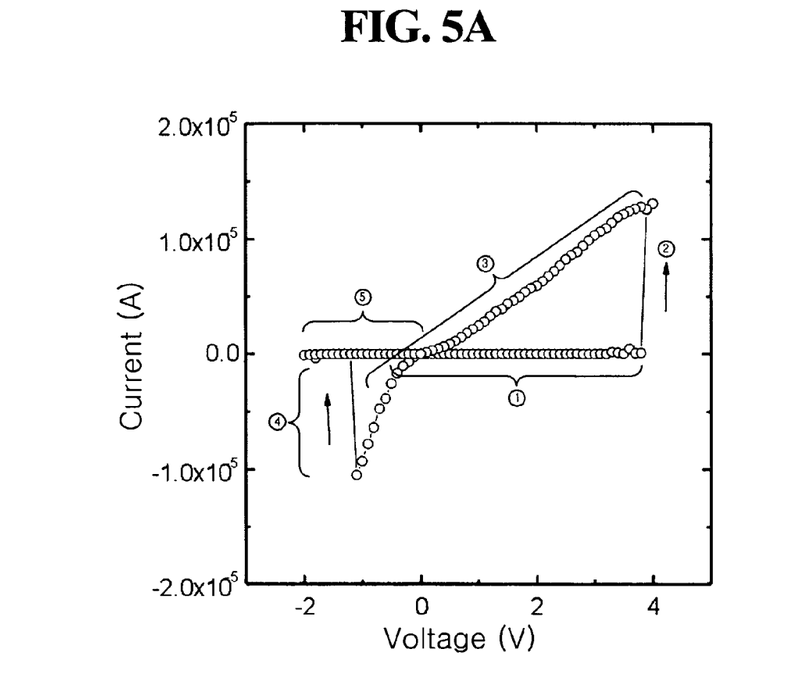
FIG. 5A is a graph depicting a variation in current depending on the voltage applied across an organic memory device to which example embodiments are applied.
Figure 5B:
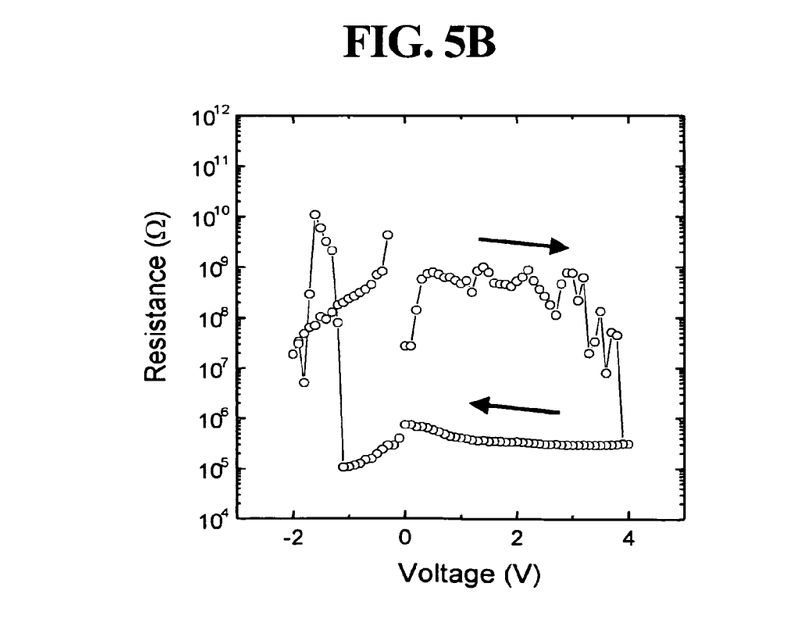
FIG. 5B is a graph depicting a variation in resistance depending on the voltage applied across the organic memory device, corresponding to the current variation of FIG. 5A.

FIGS. 5A and 5B are graphs depicting memory characteristics of the memory device driven by the memory device driving circuit of example embodiments. In the graph of FIG. 5A, the horizontal axis represents a voltage applied between the second electrode and the first electrode under the condition in which the second electrode is used as an anode, and the vertical axis represents a current flowing through the memory layer.

FIGS. 5A and 5B depict results obtained after evaluating the switching characteristics of an organic memory device manufactured in accordance with example embodiments, as a variation in current occurring when a voltage is applied across the organic memory device. In detail, FIG. 5A is a graph depicting a variation in current depending on the voltage applied across the organic memory device. FIG. 5B is a graph depicting a variation in resistance depending on the voltage applied across the organic memory device, corresponding to the current variation of FIG. 5A. The results of FIGS. 5A and 5B are those obtained when a circuit including two diodes and one resistor (FIG. 1) may be used.

By referring to FIG. 5A, when an organic memory device manufactured using an organic material having an electrical conductivity of about $10^{-12}$ S/cm or less, the memory device was switched between a higher resistance state and a lower resistance state in accordance with the applied voltage.

Referring to FIG. 5A, it may also be seen that the current-voltage characteristics of the organic memory device of example embodiments are exhibited in the form of hysteresis characteristics.

The organic memory device may exhibit a lower conductivity in an initial stage, so that it may be maintained in an OFF state. In other words, the organic memory device may be maintained in an OFF state unless the voltage applied across the organic memory device may be higher than about 3.8V (① of FIG. 5A).

When the applied voltage is higher than about 3.8 V, current may flow abruptly through the memory device. As a result, the memory device may be switched to a higher conductive state, namely, an ON state (② of FIG. 5A). As the applied voltage is subsequently lowered to about 0 V, the current flowing through the memory device may be linearly reduced (③ of FIG. 5A). As the applied voltage may be further lowered to −1 V, the resistance of the memory device may be slightly reduced. As a result, the gradient of the current may be increased (④ of FIG. 5A). This may be because the external resistance generated during the application of the positive voltage disappears during the application of the negative voltage. At the applied voltage of −1 V, resistance switching may be carried out such that the memory device may be in a higher resistance state (⑤ of FIG. 5A). The memory device may be then maintained in the higher resistance state.

Figure 6A:
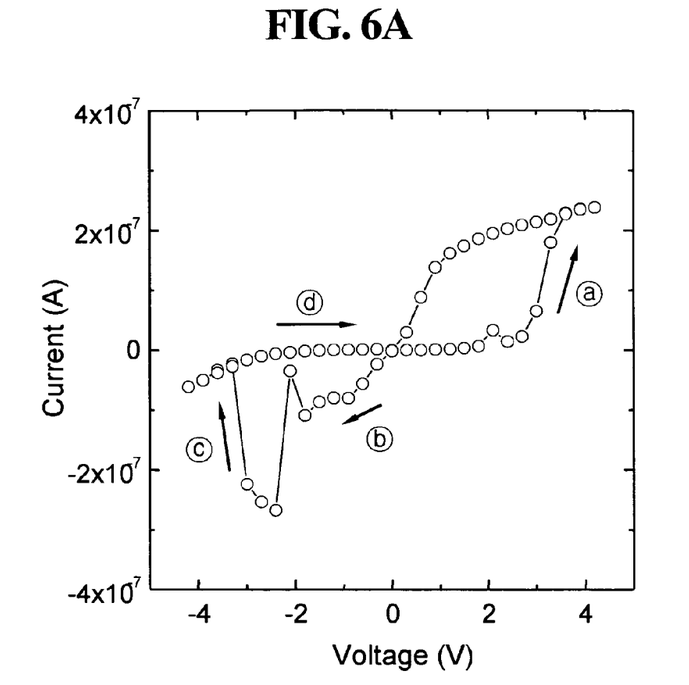
FIGS. 6A to 6C are graphs depicting the memory characteristics of a memory device driven by the memory device driving circuit of example embodiments, respectively.
Figure 6B:
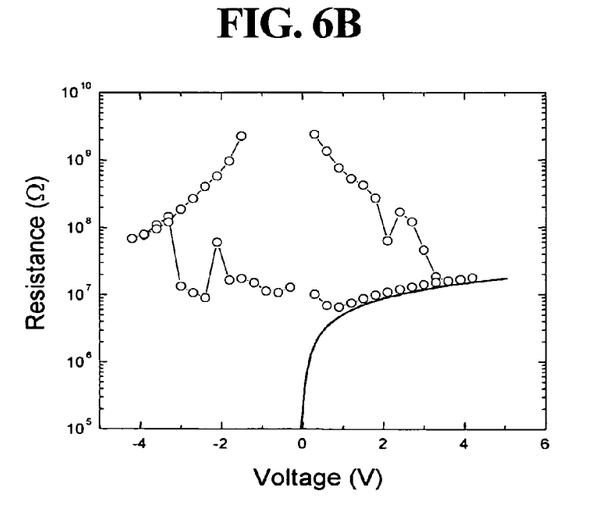
Figure 6C:
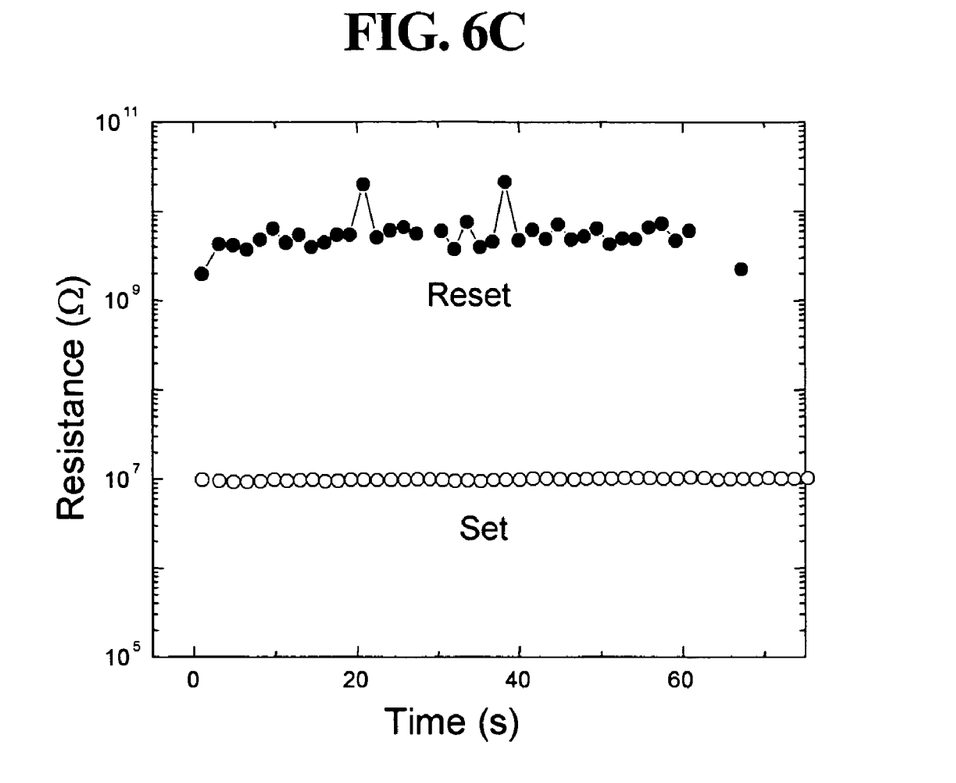

The above-described memory characteristics may also be obtained using a circuit including one Schottky diode (FIG. 2), in place of the circuit including two diodes and one resistor. The results obtained in this case are depicted in FIGS. 6A to 6C. The obtained results are similar to those of FIG. 5A. The set resistance was about $10^7 \Omega$ because the reverse resistance of the Schottky diode was about $10^7 \Omega$. Referring to FIG. 6B, it may be seen that the resistance of the memory device at the set state may be identical to the reverse resistance of the Schottky diode. The memory device was switched again to a higher resistance state at an applied voltage of −4 V. In this state, the memory device may perform a memory function. The non-volatile characteristics in each state are shown in FIG. 6C.

FIG. 6B is a graph depicting the characteristics depicted in FIG. 6A, through a relation between resistance and voltage. FIG. 6C is a graph depicting the characteristics depicted in FIG. 6A, through a variation in resistance depending on time. As shown in FIG. 6C, it may be possible to maintain the set resistance of the memory device at a desired value in accordance with the memory device driving circuit of example embodiments.

Although example embodiments have been disclosed for illustrative purposes, those skilled in the art will appreciate that various modifications, additions and substitutions are possible, without departing from the scope and spirit of the accompanying claims.

As apparent from the above description, the memory device driving circuit of example embodiments may freely adjust the set resistance of the memory device. When the set resistance is undesirably low, it may be possible to increase the set resistance without using an amplifier. When the set resistance is undesirably high, it may be possible appropriately to reduce the set resistance.

In accordance with the memory device driving circuit of example embodiments, it may be also possible to maintain the resistance of the memory cell at a desired value. Accordingly, an improvement in the operation reliability of the memory device may be achieved.

What is claimed is:

1. A memory device driving circuit for driving a memory device including a first electrode, a second electrode, and a memory layer between the first electrode and the second electrode, comprising:
    a main driver connected to the memory device, to drive the memory device; and
    a secondary driver connected between the memory device and the main driver, to control a set resistance of the memory device,
    wherein the secondary driver comprises:
    a first diode connected to one end of the memory device;
    a second diode connected to the first diode in parallel; and
    a resistor connected to the first diode in series, and connected to the second diode in parallel,
    wherein the first and second diodes are connected to be oppositely biased.

2. The memory device driving circuit according to claim 1, wherein the secondary driver is externally connected to the memory device.

3. The memory device driving circuit according to claim 1, wherein each of the first and second diodes is a P-N diode or a Schottky diode.

4. The memory device driving circuit according to claim 1, wherein the secondary driver is a Schottky junction between the first electrode and the memory layer in the memory device.

5. The memory device driving circuit according to claim 4, wherein the Schottky junction is a semiconductor contacting a metal material of the second electrode.

6. The memory device driving circuit according to claim 1, wherein the memory layer of the memory device is made of an organic material having hetero atoms exhibiting an electrical conductivity of about $10^{-12}$ S/cm or less.

7. The memory device driving circuit according to claim 6, wherein the organic material is a polymer selected from the group consisting of poly(2-vinyl pyridine), poly(4-vinyl pyridine), polyvinyl pyrolidone, polyallylamine, polyethyleneamine, polyacrylamide, polyamidoamine, and polyimide.

8. The memory device driving circuit according to claim 1, wherein one of the first and second electrodes is made of a material selected from gold, silver, platinum, copper, cobalt, nickel, tin, aluminum, indium tin oxide, and titanium.

9. A method for fabricating a memory device driving circuit for driving a memory device including a first electrode, a second electrode, and a memory layer between the first electrode and the second electrode, comprising:
    connecting a main driver to the memory device, to drive the memory device; and
    connecting a secondary driver between the memory device and the main driver, to control a set resistance of the memory device,
    wherein the secondary driver comprises:
    a first diode connected to one end of the memory device:
    a second diode connected to the first diode in parallel; and
    a resistor connected to the first diode in series, arid connected to the second diode in parallel,
    wherein the first and second diodes are connected to be oppositely biased.

10. The method according to claim 9, wherein the secondary driver is externally connected to the memory device.

11. The method according to claim 9, wherein each of the first and second diodes is a P-N diode or a Schottky diode.

12. The method according to claim 9, wherein the secondary driver is a Schottky junction between the first electrode and the memory layer in the memory device.

13. The method according to claim 12, wherein the Schottky junction is a semiconductor contacting a metal material of the second electrode.

14. The method according to claim 9, wherein the memory layer of the memory device is made of an organic material having heteroatoms exhibiting an electrical conductivity of about $10^{-12}$ S/cm or less.

15. The method according to claim 14, wherein the organic material is a polymer selected from the group consisting of poly(2-vinyl pyridine), poly(4-vinyl pyridine), polyvinyl pyrolidone, polyallylamine, polyethyleneamine, polyacrylamide, polyamidoamine, and polyimide.

16. The method according to claim 9, wherein one of the first and second electrodes is made of a material selected from gold, silver, platinum, copper, cobalt, nickel, tin, aluminum, indium tin oxide, and titanium.

* * * * *